United States Patent [19]
Zakel et al.

[11] Patent Number: 6,153,940
[45] Date of Patent: Nov. 28, 2000

[54] CORE METAL SOLDERING KNOB FLIP-CHIP TECHNOLOGY

[75] Inventors: Elke Zakel; Jens Nave, both of Berlin, Germany; Joachim Eldring, Phoenix, Ariz.

[73] Assignee: Fraunhofer Gesellschaft zur Foerderung der angewandten Forschung e.V., Munich, Germany

[21] Appl. No.: 08/836,804

[22] PCT Filed: Nov. 10, 1995

[86] PCT No.: PCT/DE95/01589

§ 371 Date: Aug. 4, 1997

§ 102(e) Date: Aug. 4, 1997

[87] PCT Pub. No.: WO96/16442

PCT Pub. Date: May 30, 1996

[30] Foreign Application Priority Data

Nov. 17, 1994 [DE] Germany ............................ 44 40 991

[51] Int. Cl.⁷ ...................... H01L 23/48; H01L 23/52; H01L 29/40
[52] U.S. Cl. .................. 257/779; 257/737; 257/738; 438/613; 228/180.22
[58] Field of Search ..................... 257/779, 737, 257/738; 438/613; 228/180.22

[56] References Cited

U.S. PATENT DOCUMENTS

| | | | |
|---|---|---|---|
| 4,237,607 | 12/1980 | Ohno | 29/840 |
| 4,268,849 | 5/1981 | Gray et al. | 257/737 |
| 5,075,965 | 12/1991 | Carey et al. | 228/180.22 |
| 5,147,084 | 9/1992 | Behun et al. | 228/180.22 |
| 5,251,806 | 10/1993 | Agawala et al. | 228/180.22 |
| 5,349,500 | 9/1994 | Casson et al. | 361/749 |
| 5,672,913 | 9/1997 | Baldwin et al. | 257/737 |
| 5,698,465 | 12/1997 | Lynch et al. | 438/613 |
| 5,729,440 | 3/1998 | Jimarez et al. | 257/738 |
| 5,747,881 | 5/1998 | Hosomi et al. | 257/738 |

FOREIGN PATENT DOCUMENTS

| | | | |
|---|---|---|---|
| 59-188147 | 10/1984 | Japan | 257/738 |
| 4-58573 | 2/1992 | Japan | 257/737 |
| 4-266037 | 9/1992 | Japan | 257/737 |
| 6-84916 | 3/1994 | Japan | 257/737 |

*Primary Examiner*—David Hardy
*Assistant Examiner*—Jhihan B. Clark
*Attorney, Agent, or Firm*—Karl Hormann

[57] ABSTRACT

The invention relates to a solder bump of an inhomogeneous material composition for connecting contact pad metallizations of different electronic components or substrates in flip-chip technology, as well as to a method of making such a solder bump. A solder bump consists of a space defining high-melting solder bump core and a layer of a preferably low-melting solder material deposited thereon. The preconditions required for soldering, such as solder deposition, bump height and soldering temperature are thus all combined in the solder bump.

38 Claims, 5 Drawing Sheets

CORE METAL SOLDERING KNOB FLIP-CHIP TECHNOLOGY

BACKGROUND OF THE INVENTION

1. Field of the Invention

The invention relates to a solder bump of inhomogeneous material composition, in particular for producing connections between connector surfaces of electrical components or substrates in flip-chip technology, as well as to a method of fabricating such a solder bump.

Its field of application is wherever two or more material components (e.g.: chips, different substrate materials, IC components, electronic structural elements) are to be connected to each other mechanically and/or electrically by solder material. For this purpose, several processes have been established in the past, such as, for instance, wire bonding in which two terminal or metallization pads are connected to each other. In the more recent flip-chip technology solder bumps are applied by conventional methods to the terminal or contact surfaces of the material components to be connected. A plurality of permanent connections are thereafter fabricated in a single fabrication step by soldering, thermo-compression or bonding to yield a high connection or terminal density. This is used, for instance, for connecting two or more chips or for mounting and/or contacting chips on substrates, especially for forming multi-chip-modules (MCM). To this end, the solder bumps are applied either to a terminal pad of the substrate only, or to the terminal pad of the chip, or to both. The term used in the art for applying solder bumps to terminal pads is "bumping". In the context of flip-chip technology, the invention may generally be practiced in all those fields in which ever smaller components or increasingly higher frequencies (or very low capacitances and inductances) or high integration densities are required or beneficial, as, for instance, in the fields of application of integrated optics and/or micro wave technology.

2. The State of the Art

A plurality of functional layers are required for the fabrication of a solder bump. The lowest layer system is called the under bump metallization (abbr.: UBM). It serves as a priming layer for the bond pad metallization of a chip and, at the same time, as a wettable layer for the solder system subsequently to be applied, viz.: a solder bump. To satisfy these two functions, a plurality of layers are conventionally applied as UBM, such as, for instance, of chromium (Cr) and copper (Cu), titanium (Ti) and copper (Cu), titanium-tungsten (Ti:W) and copper (Cu). Since conventional bumps melt completely in the reflow and soldering processes of the flip-chip assembly and come into contact with the UBM, this metallurgy must be specially optimized in respect of mechanical stresses and intermetallic phase formations. In conventional solder bumps, the quality of the UBM is exceptionally critical as regards the reliability of the complete assembly.

The soldering metal is deposited on the UBM layer either as a layer system or as an alloy. The processes employed to this end usually are vapor deposition or galvanic processes, as well as autocatalytic deposition processes. Thereafter, the entire layer structure is homogenized by a reflow process, with the temperature being selected such that the entire solder structure is fused. The galvanic processes and vapor deposition processes require a process artwork, such as a mask, by means of which the position of the connector surfaces and their dimensions and distances from one another are determined. The photo lithographic structuring methods require clean room conditions and involve high investment costs. This, in respect of galvanic processes and vapor deposition processes, entails serious disadvantages, viz.; they can be economically employed only in large production runs and with complete wafers. Autocatalytic processes suffer from the disadvantage that in most applications they are severely limited in respect of the materials which may be used.

Normally, solder bumps made of a homogeneous material are at present used in flip-chip fabrication. Among them are, for instance, the following alloys of tin (Sn) and lead (Pb): Sn/Pb 60/40 (containing 60% by weight of tin and 40% by weight of lead), Pb/Sn 90/10, Pb/Sn 95/5 or other concentrations. Such solder bumps are characterized by having a homogeneous composition and a defined melting temperature.

For flip-chip fabrication on cost-efficient polymeric substrate materials, such as circuit boards for instance, a soldering temperature below about 250° C. is required to prevent destruction of the substrate materials. Also, there must be compatibility with conventionally assembled and enclosed SMD components. In order to ensure this, low-melting (melting temperature 183° C.) eutectic Sn/Pb solder (Sn/Pb 63/37) is at present known to be applied to the substrate, whereas a high melting Sn/Pb alloy, such as e.g. Pb/Sn 90/10 and/or Pb/Sn 95/5 having melting temperatures in excess of 300° C. is applied to the chip. In this context, the high melting Sn/Pb alloys are reliable bump metallurgies which are particularly resistant against material fatigue. A process of fabricating such solder connections is known from the assay "Practical Chip Integration into Standard FR-4 Surface-Mount processes: Assembly, Repair and Manufacturing Issues" by Terry F. Hayden and Julian P. Partridge published in ITAP & Flip Chip Proceedings, San Jose, Calif., Feb. 15, 1994–Feb. 18, 1994. In this process, homogeneous Sn/Pb solder bumps (Pb/Sn 97/3 or Pb/Sn 95/5 or Pb/Sn 90/10) applied to a chip are soldered at low temperatures to solder deposits of Sn/Pb 63/37 on a substrate.

The fabrication of solder deposits on the substrate (e.g. circuit board, ceramic, etc.) constitutes a high cost and technically complex technology. Moreover, there is only very limited compatibility with SMD (surface mount device) technology for insertion on standard chips, since, when, for instance, affixing (in particular soldering) the SMD components on the substrate during the SMT (surface mount technology) process, the solder deposits for the subsequent flip-chip assembly will also melt, for which reason these unevenly formed solder deposits must be planarized in an additional process step prior to the flip-chip assembly.

A process of fabricating electrical and/or mechanical connections or contacts between adjacent contact pads associated with different components or substrates in flip-chip technology is known from published WO 89/02653. In this process, electrically conductive indium is used as the basic material for the solder bumps which are always applied to both contact pads to be connected. A thin coating of bismuth is applied thereon with the ratio of the thickness of the layer of indium relative to bismuth being about 100. On the one hand, the thin bismuth layer prevents the formation of indium oxide which would detrimentally affect the mechanical stability and electrical conductivity of the subsequent solder connection. On the other hand, the material system of indium and bismuth constitutes a eutectic composition, with the eutectic temperature of 72° C. being significantly below the melting temperatures of indium (157.4° C.) and bismuth (271.3° C.) and ensuring that the photo detectors to be soldered together are not damaged or destroyed. The eutectic alloy of indium and bismuth is only formed during the first soldering process and extends only partially into the indium layer. In another soldering process, the solder bumps are not applied in identical shape on both substrate surfaces as heretofore practiced, but, instead, during the soldering process, each solder bump on one of the substrate surfaces is pressed between two solder bumps on the surface of the other substrate.

A method of contacting a chip with a substrate is known from U.S. Pat. No. 3,986,255 whereby the contact or solder bumps are formed of an exterior gold alloy and of a magnetic material in its interior. More particularly, the magnetic solder bump core consists of a comparatively hard material, such as, e.g., iron, nickel and/or cobalt. By comparison with the solder bump core the gold alloy deposited on the solder bump core is soft and is used as solder material; materials used for this purpose are gold, silver, lead, tin or indium, whereby the preferred embodiment consists of a sequence of layers of gold-tin-gold. The volume of the solder bump core typically amounts to about 25%–50% of the entire volume of the solder bump. The temperature when contacting the chip with the substrate is selected such that while the solder bump core of a solder bump does not melt the solder material does indeed melt. In the contacting method described in U.S. Pat. No. 3,986,255 the previously described solder bumps are either all of them unilaterally deposited on the chip or on the substrate. The different layers for forming the solder bump, i.e. their core and solder material, are deposited either by vapor deposition or by current-free precipitation. The solder bumps are preferably deposited on the chip so that because of the magnetic core of the solder chips, the chip which is usually very small and thus very difficult to handle may be transported, held and aligned in a simple manner and safely by means of (electro)-magnetic devices. The methods for forming such solder bumps are, however, very complex.

Furthermore, European Patent specification EP 0,073,383 discloses a method of connecting a semiconductor element with a substrate, whereby the contact metallizations or contact bumps used for the connection between the contact pads of the substrate and the semiconductor element are either deposited on the contact pads or the semiconductor element or an the substrate and consist of at least two layers, whereby materials are selected for the uppermost layer and for the next adjacent layer below the uppermost layer for which there exists a eutectic composition. The layer structure selected and the materials are to ensure an improved mechanical stability of the connection vis-a-vis thermal (alternate) stress. During the contacting step the solder bumps deposited on the contact pads of the semiconductor element are aligned relative to the contact pads of the substrate, and they are then soldered to the substrate contact pads under pressure and temperature. The selected soldering temperature is selected to be near the eutectic temperature of the materials of the uppermost layers of the contact bump, so that a eutectic substance is formed of these materials. Such materials as tin, indium or bismuth are used as materials for the uppermost layer, lead is the preferred material for the layer below. The layers are fabricated by vapor deposition or galvanic precipitation. The processes of fabricating the contact bump layers are technically very complex.

A contact bump and a method of its fabrication are known from German Patent specification 4,025,622, in which a gold layer is initially deposited on a contact surface and thereafter a tin layer of substantially smaller volume is deposited (according to FIG. 1 galvanically precipitated or vapor deposited) on the gold layer. The layer structure is subjected to a reflow process at a temperature of about 400° C. The resultant contact bump consists of an unalloyed gold layer in contact with the contact pad and a gold-enriched eutectic gold-tin alloy layer of 80% gold and 20% tin which does not contact the contact pad, as well as of a gold-tin phase intermediate layer between the previously mentioned layers.

Furthermore, a method of connecting an electronic component and a substrate is known from European patent specification EP 0,177,042 whereby the contact metallizations each form a connection between a contact pad of the substrate and of the electronic component and are constructed such that a contact bump of low melting solder material is deposited on each contact pad of the substrate and of the electronic component and, furthermore, a connection is formed by a higher melting columnar solder material element between such a substrate contact pad on which solder material is deposited and a contact pad of the electronic component also provided with solder material. One end of the columnar solder material element is connected to the low melting solder material on the substrate, and the other end of the columnar solder material element is connected to the low melting solder material bump of the component. The fabrication of such a connection is accomplished by initially soldering a columnar higher melting solder material element to a lower melting solder bump deposited on a contact pad of the substrate. Thereafter, substrate and electronic component are aligned such that the free end of a columnar solder material element is brought into contact with the lower melting solder material of the associated contact pad of the component. Thereafter, the solder material on the component is heated to the point of melting thus soldering it to the free end of each respective columnar solder material element. The low melting solder bumps preferably consist of a eutectic material alloy, and they are made by depositing solder paste followed by reflow or by dip processes. The columnar solder material of cut off wire is to make possible a large distance between the substrate and the component, on the one hand, and on the other hand it is to make possible a high contact metallization density. The solder connection of the columnar solder material element which is difficult and cumbersome as well as difficult to reproduce, is disadvantageous, as is the fact that there are two low melting areas in each contact metallization.

German patent specification 4,131,413 discloses a bonding method for semiconductor chips. In it, a first ball bump of gold is initially deposited on a contact pad of a chip. A second gold ball bump is deposited on the first ball bump. Thereafter, a lead ball bump is deposited thereon. The chip is aligned "face down" with such layered contact bumps relative to the substrate, and the connections to the substrate contact pads are formed by melting of the lead balls only. The purpose of the first gold ball bump is to make a solderable end metallization, since lead would not wet the aluminum contact pad and thus would prevent a lasting connection. The second ball bump increases the height of the connection.

BRIEF SUMMARY OF THE INVENTION

Proceeding from the state of the art described supra, it is a task of the invention to provide a method of fabricating a solder bump and a structure of a solder bump which ensures a minimum height of the subsequent soldered connection, makes possible a stable electrical and/or mechanical connection of the connected contact pads, is suitable for comparatively low soldering temperatures, and may be fabricated quickly and economically with low equipment outlay.

A solution in accordance with the invention comprises solder bumps having the elements set forth infra as well as methods of fabricating a solder bump in accordance with the invention comprising the steps to be defined in detail hereinafter. Advantageous embodiments and improvements are defined in the ensuring specification.

DESCRIPTION OF THE INVENTION

A solder pump in accordance with the invention is provided with an inhomogeneous material composition whereby a proportion of the solder material of the solder bump to be melted has a melting temperature which is lower than the soldering temperature and a core section of the solder bump contributing to defining a minimum height of the solder bump has a melting temperature which is higher than the soldering temperature, and the portion of the solder material to be melted contains a large proportion of the solder material required for a solder connection.

By appropriately forming the core layer, for instance as a solder bump base, the final height of the solder connection or the distance between chip and substrate may predetermined. In this connection, the minimum distance is determined by the height the preferably layered core section. The remaining height is dependent upon the geometric surface of the core layer covered by the applied solder material and, additionally, upon type, quantity and surface tension of the solder material itself, as well as upon the pressure applied on the solder connection during its fabrication.

In one embodiment of the invention, a priming layer or under bump metallization (UBM) is applied to the core layer or core section. Depending on the base substrate, a layer composition of chromium(Cr)-copper(Cu), titanium (Ti)-tungsten(W)-gold(Au), nickel(Ni)-chromium(Cr)-nickel (Ni), titanium(Ti)-copper(Cu) or a layer sequence of titanium-tungsten(Ti:W)-copper(Cu) is used. Since the core layer of a solder bump in accordance with the invention does not melt during the soldering process and since, moreover, it is composed such that the liquid solder does not metallurgically react with the priming layer or UBM, the wettability of the UBM layer by the liquid solder required by the known processes is no longer a basic requirement with the solder bump of the invention. In a later process step, that portion of the UBM which protrudes beyond the core layer of a solder bump is selectively etched by dry or wet chemical techniques without, however, attacking the UBM below the core layer. This may also be accomplished by lift-off processes.

Preferably, a solder bump in accordance with the invention is built up as a sequence of layers, with a further layer of solder material being applied to the core section or core layer. The layers may be deposited galvanically, current-free, by vapor deposition or mechanically by impressing a preformed solder ball, or by solder wire of appropriate composition using wire bonders (ball bonders or wedge bonders). To this end, identical or different processes may be used to apply the core layer and the solder material. The following variants are possible: the core layer and the solder material layer are galvanically precipitated, the core layer and the solder material layer are vapor deposited, the core layer is galvanically precipitated or vapor deposited and the solder material layer is mechanically applied, the core layer and the solder material layer are applied by the same or by different mechanical processes. Among the mechanical processes are impressing a preformed solder ball, ball bumping and wedge bumping. Ball bumping or stud bumping is a bumping process derived from the ball bonding process, in which a solder bump is fabricated as a ball bump by a ball bonding device; the same applies mutatis mutandis to wedge bumping. Ball bumping and wedge bumping may be used for applying the solder bump core as well as for applying the solder material. If the solder bump core is applied as a ball bump, a process step of planarizing the ball solder bump is required prior to applying the solder material.

Different types of resist (dry as well as wet) and heights of resist may be employed in fabricating solder bumps in accordance with the invention, yielding the socalled straight wall formations or mushroom formations. One or more spatially separated solder bumps in accordance with the invention may thus be fabricated by an appropriate process control and process steps.

After the application of the material for the solder bump core and, if required, a planarizing step, as well as the subsequent application of solder material, a reflow process is performed in one embodiment of the invention in which at least the solder material of the layered solder bump is melted, and homogenization as well as a cuspated configuration of the surface of the solder material are attained as a result of surface tension. Core metal solder bumps reflowed in this manner will hereinafter sometimes be referred to as hard core solder bumps.

Materials of electrical and mechanical long term stability, in particular pure metals such as gold, nickel, copper, palladium or alloys of palladium and silver, are used for the core section of a solder bump in accordance with the invention. The solder material applied to the solder bumps consists of a lead-tin-alloy or a gold-tin-alloy or a tin-silver-alloy or an indium alloy, a eutectic composition being preferably selected to result in a comparatively low eutectic temperature In this manner, a low soldering temperature slightly above the eutectic temperature may also be selected.

In a further embodiment of the invention, a eutectic composition of the solder material is obtained by depositing one of the materials of a two component eutectic material system as the core layer, by using the other material component as the solder material applied thereon, and by thereafter melting at least a portion of the solder material in a reflow process to form a eutectic solder material alloy in a metallurgic reaction. In the simplest case, the reflow process and the soldering step will take place together. A reflow process in advance of the soldering step, as, for instance, for driving out gas and for homogenizing, is of even advantageous if the applied or deposited solder material itself comprises a eutectic composition.

The following advantages in particular are obtained by the invention.

In mechanical bumping methods the process of bumping may be controlled by software, so that is may be quickly defined and modified. In particular, they may, for instance, be adjusted in accordance with subsequent changes in chips and substrates. The high flexibility and high development speed are particularly advantageous in small production runs and in prototype fabrication in which electronic components, because of their sometimes high prices or because of their limited availability, are available as single samples rather than as complete wafers, and in small lots. In such circumstances, galvanic processes and vapor deposition processes with their expensive mask processes and clean room conditions are uneconomical. Moreover, in contrast to software controlled mechanical bumping processes, mask oriented processes are inflexible since geometries can no longer be altered once the masks have been made.

Thus, the invention makes possible quick and costefficient fabrication, particularly of prototypes and small production runs. By fabricating solder bumps in accordance with the invention, mask process steps are avoided entirely or partially, depending upon whether the solder bump as well as the solder material are applied by mechanical bumping processes, or whether the solder material alone is mechanically applied. In this manner, production time and costs are significantly lowered, all the more so in view of the fact that the bonding equipment used in the mechanical bumping process, i.e. the wire bonder, as compared to a clean room infrastructure, is inexpensive and that most large development institutions own such equipment. With the wire bonder used, only the control software need be modified for fabricating solder bumps in accordance with the invention. The previously mentioned advantages are especially apparent in an embodiment in which both the solder bump core and the solder material to be applied thereon are deposited by either the same or by different mechanical bumping processes.

A further advantage of a core metal solder bump in accordance with the invention is that because of a low melting cap of solder material on the core of the solder, bump bonding, and more particularly flip-chip bonding, are made possible at reduced bonding forces compared to pure metal solder bumps. This results in the further advantage of lower mechanical stress on the electronic components and/or substrates, thus leading to reduced waste and, consequently, increased yields.

The renewed reflow of the solder cap of a core metal solder bump during flip-chip contacting allows for self-alignment, for instance of an electronic component on a substrate, while the solder material is in its molten liquid state. This results in a reduced stress from mechanical tension on the fabricated flip-chip contacts and, hence, in an improved reliability of the contacts.

Comparatively low soldering temperatures, preferably below 250° C., are attainable by the selection of materials for a core metal solder bump in accordance with the invention. Accordingly, materials of lower heat resistance, such as ceramics or semi-conductor materials, may also be used as substrate materials, and their cost advantages may be drawn upon, as in MCM production. The invention is, therefore, not restricted to ceramic and semiconductor substrates, but it may be practiced on any desired substrates, such as different plastics or glasses.

Because of its non-melting core layer, a solder bump in accordance with the invention will ensure a minimum height, every solder bump containing at least a large portion of the solder material necessary for its solder connection; and by the selection of its solder material, it also defines the minimum soldering temperature. In a special embodiment of the invention, the entire solder material required for a solder connection is provided by a solder bump in accordance with the invention. The conditions or characteristics required for soldering, such a solder deposit, height of the bump and soldering temperature, are thus all combined in a single solder bump.

An otherwise expensive and technologically complex deposit of solder on a substrate direct is no longer required with an inventive solder bump which provides all of the solder material for its solder connection. Compatibility with SMD assembly, consisting of a simplification of the overall process of SMD flip-chip mixed mounting, for planarizing of the solder bumps or solder deposits after SMD mounting is avoided, thereby also avoiding a process step which would otherwise be necessary.

Without limitation of its general concepts, the invention will hereinafter be described in greater detail on the basis of embodiments and with reference to the drawings, in which.

Figure 1A:
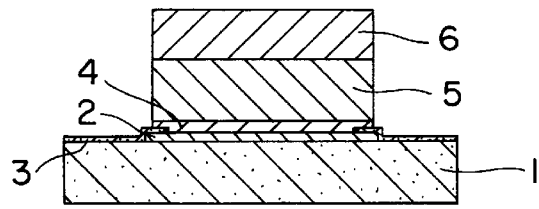
FIG. 1A depicts a layered structure of a core metal solder bump consisting of a high melting Pb/Sn layer and a Pb/Sn layer in a eutectic composition.

A first embodiment of a solder bump in accordance with the invention is shown in FIG. 1A. Silicon is used as a chip substrate 1, with an aluminum contact metallization deposited on the silicon surface as, for instance, by sputtering or by vapor position. The aluminum pad 2 and the adjacent silicon substrate are covered by a passivation layer 3 of silicon dioxide or silicon nitride, e.g., with the larger area of the aluminum pad having subsequently been exposed again in a contact window. A UBM (under bump metallization) is deposited on the exposed area of the aluminum pad which normally is part of a printed circuit structure. A high melting Pb/Sn layer 5, of, e.g., 90% by weight of lead and 10% by weight of tin (or of Pb/Sn 95/5) is, in turn, deposited on the UBM 4. A Pb/Sn layer 6 in a eutectic composition (Sn/Pb 63/37) is deposited on the core layer by a galvanic process, as the second layer of the solder bump in accordance with the invention.

Figure 1B:
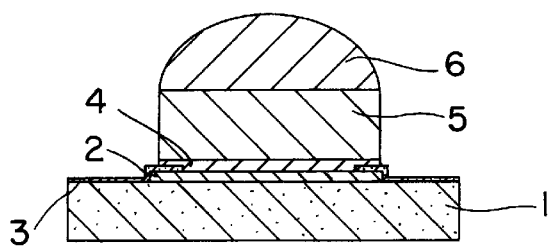
FIG. 1B depicts the structure of the core metal solder bump of FIG. 1A after a controlled reflow process.

The solder bump depicted in FIG. 1A may be subjected to a reflow process during which gases entrapped in the second layer 6 are driven out, for instance. FIG. 1B shows the solder bump of FIG. 1A after such a reflow process in which only the second layer 6 has reflowed by appropriate temperature control; and because of its surface tension, it has taken on a cuspated configuration.

Figure 1C:
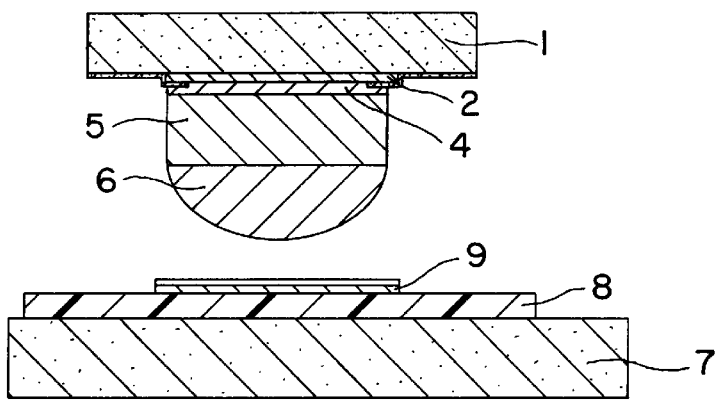
FIG. 1C depicts the flip-chip assembly of the core metal solder bump of FIG. 1B.
Figure 1D:
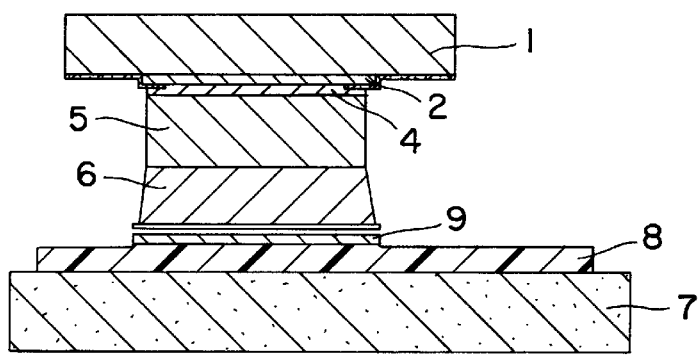
FIG. 1D depicts the flip-chip soldering of the core metal solder bump of FIG. 1C.

FIG. 1C depicts the solder bump of FIG. 1A and FIG. 1B fabricated on the chip substrate, together with the substrate with which the solder bump is to form a mechanical and electrical connection. Preferably, the substrate is an MCM-L-, MCM-C-, MCM-D-substrate or a printed circuit board with printed circuits 8, for instance, of copper formed thereon. At the contact pads, the printed circuits are in turn provided with a pad metallization 9 consisting, for instance, of nickel/gold. Following alignment of the solder bump relative to the pad metallization, the process step of flip-chip soldering may be carried out. To this end, the pad metallization and the second layer of the solder bump are placed in close proximity, and the soldering temperature is selected such that the second layer of the solder bump in accordance with the invention is melted to wet the pad metallization and to form the connection. FIG. 1D depicts the completed solder connection.

Figure 2A:
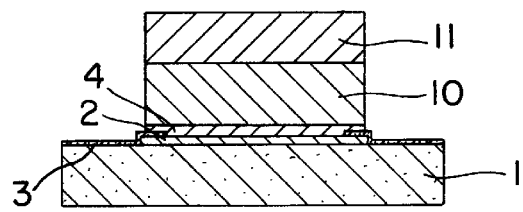
FIG. 2A depicts the layered structure of a core metal solder bump consisting of a layer of pure lead and a layer of pure tin applied thereon.
Figure 2B:
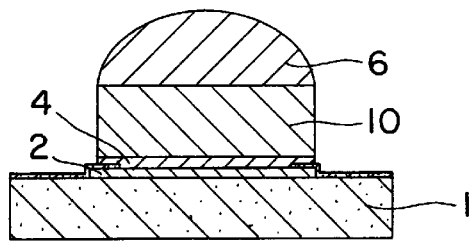
FIG. 2B depicts the structure of a core metal solder bump of FIG. 2A after a controlled reflow process forming a eutectic Pb/Sn layer instead of a layer of pure tin.
Figure 2C:
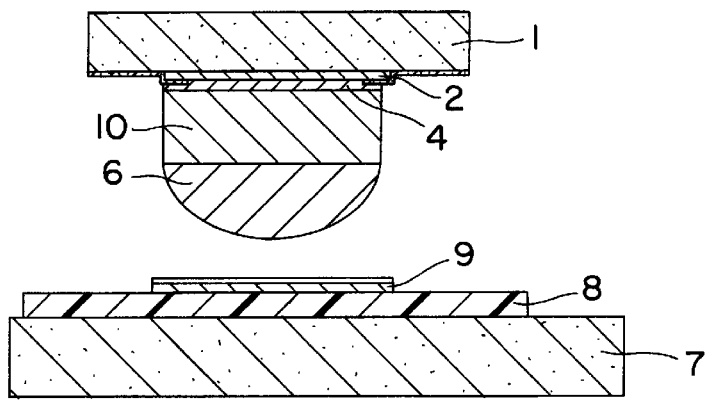
FIG. 2C depicts the flip-chip assembly of the core metal solder bump of FIG. 2B.
Figure 2D:
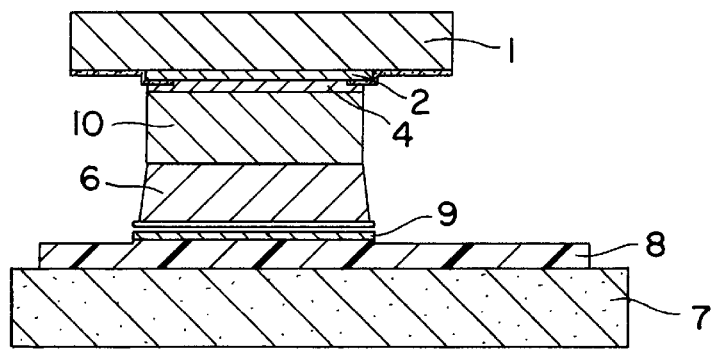
FIG. 2D depicts flip-chip soldering of the core metal solder bump of FIG. 2C.

In a second embodiment a layer 10 of pure lead is deposited as a core layer on the UBM. As a second layer of the solder bump, a layer 11 of pure tin is deposited thereon (FIG. 2A). Following a reflow process, shown in FIG. 2B, a tin-lead layer of eutectic composition Sn/Pb 63/37 has been formed instead of the layer of pure tin. Flip-chip assembly and flip-chip soldering, shown in FIG. 2C and FIG. 2D, are carried out as previously described in connection with the first embodiment.

Figure 3:
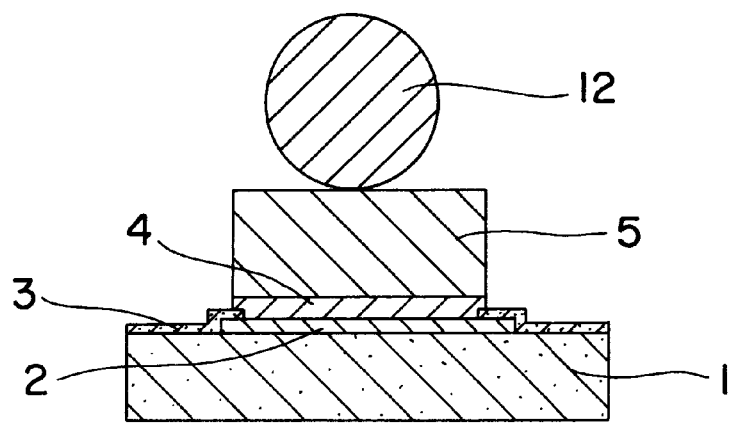
FIG. 3 depicts the structure of a core metal solder bump consisting of a high melting Pb/Sn core layer and a solder ball of eutectic Pb/Sn pressed thereon.

In a third embodiment (FIG. 3A) depositing of the uppermost "layer" of a solder bump is carried out by mechanically depositing and pressing a prefabricated solder ball 12 on the previously applied core layer 5. A solder bump structured in this manner is subjected to a subsequent reflow process and will then assume the shape shown in FIG. 1B. Subsequent flip-chip assembly and flip-chip soldering are carried out in accordance with the images of FIG. 1C and FIG. 1D.

Figure 4:
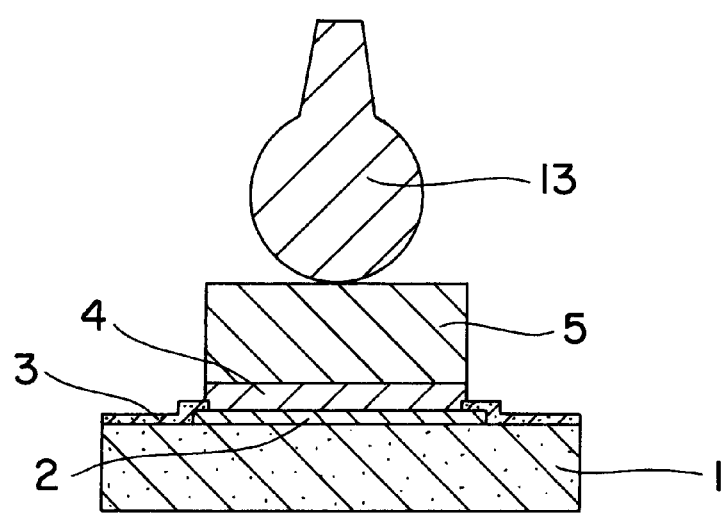
FIG. 4 depicts the structure of a core metal solder bump consisting of a high melting Pb/Sn layer and a stud bump made by a soldering wire.

In a further embodiment (FIG. 4A), the second, uppermost layer of a core metal solder bump is mechanically fabricated from a solder wire by forming a so-called ball bump or stud bump 13. A solder bump formed in this manner is thereafter subjected to a reflow process and will then assume the shape in accordance with FIG. 1B. Subsequent flip-chip assembly and flip-chip soldering are carried out as shown in FIG. 1C and FIG. 1D.

Figure 5A:
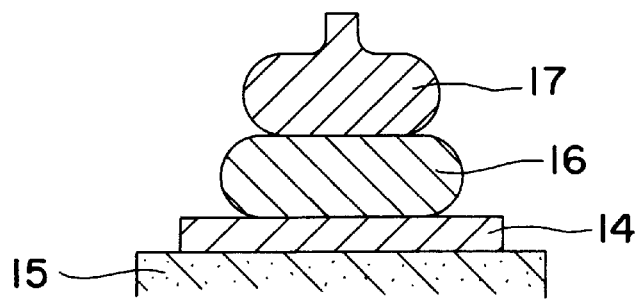
FIG. 5A depicts the structure of a core metal solder bump consisting of a mechanically deposited and planarized ball bump forming the core of the solder bump, and of a solder ball bump.
Figure 8A:
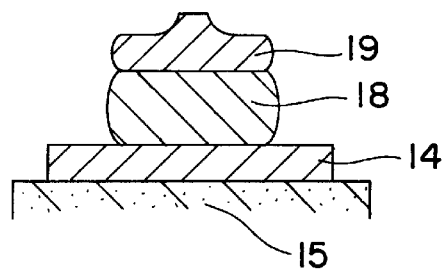
FIG. 8A depicts the structure of a core metal solder bump consisting of a solder bump core and of a solder bump.
Figure 8B:
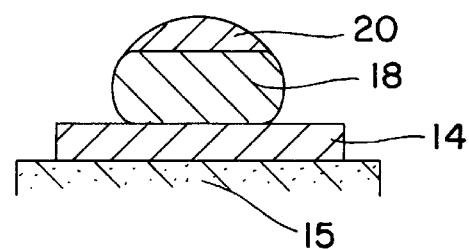
FIG. 8B depicts the structure of a core metal solder bump of FIG. 8.1 after a successfully executed reflow process.

In a further embodiment of the invention in accordance with FIG. 5A., ball bumps 16 of gold-palladium alloy with an about 1% share of palladium are bonded to gold contact pads 14 on a ceramic substrate 15 by means of a ball bonding apparatus. The initial diameters of the ball bumps before bond deformation are about 80 µm. The applied stud bumps are subsequently planarized by means of a planar die. In the next process step, a ball bump 17 (initial diameter 40 µm) of a lead-tin alloy, preferably consisting of a eutectic composition, or of a composition of about 2.5% tin and a remainder of lead, is deposited on every one of these hard gold-palladium solder pump cores by means of a ball bonding apparatus. By reflowing of the layered solder bump of FIG. 5A at a temperature of about 310° C. a solder cap of a eutectic gold-tin alloy composition will be formed. The sequence of the reflow process with a layered solder bump (solder bump core 18, solder bump 19) prior to the reflow process and with the newly formed solder bump (solder bump core 18, reflowed solder bump or solder cap 20) after the reflow process is shown in FIG. 8A and FIG. 8B.

Figure 5B:
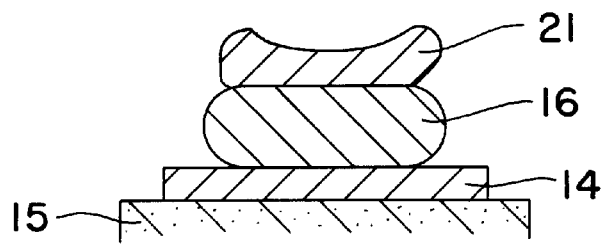
FIG. 5B depicts the structure of a core metal solder bump consisting of a mechanically deposited and planarized ball bump forming the core of the solder bump, and of a solder wedge bump.
Figure 6A:
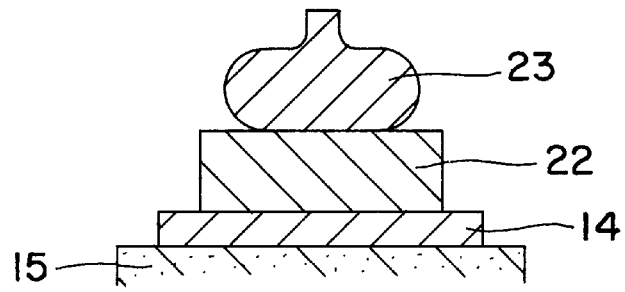
FIG. 6A depicts the structure of a core metal solder bump consisting of a galvanically or autocatalytically deposited core layer and of a solder ball bump.
Figure 6B:
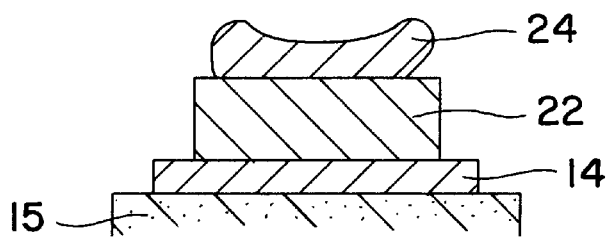
FIG. 6B depicts the structure of a core metal solder bump consisting of a galvanically or autocatalytically deposited core layer and of a solder wedge bump.
Figure 7A:
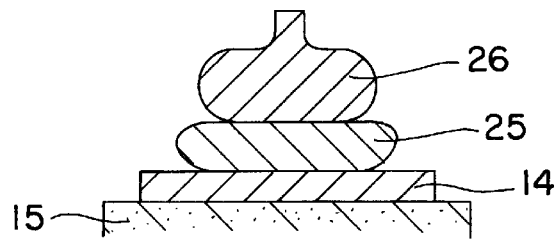
FIG. 7A depicts the structure of a core metal solder bump consisting of a mechanically deposited wedge bump forming the core of the solder bump and of a solder ball bump.
Figure 7B:
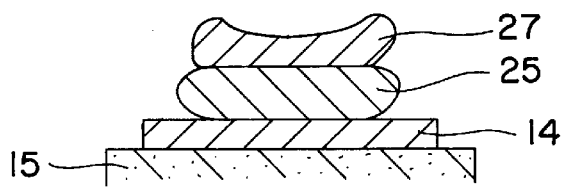
FIG. 7B depicts the structure of a core metal solder bump consisting of a mechanically deposited wedge bump forming the core of the solder bump and of a solder wedge bump.

In an embodiment of the invention according to FIG. 5B, a lead-tin wedge bump 21 (solder wire diameter 33 µm) is deposited on the gold-palladium solder bump cores applied and planarized in accordance with FIG. 5B. Thereafter, the layered solder bump of FIG. 5B is subjected to a reflow process according to FIG. 8A and FIG. 8B.

What is claimed is:

1. A method of forming on a contact surface a non-homogeneous solder bump of the kind providing for a solder connection of a predetermined height, comprising the steps of:

depositing on the contact surface, by one of impressing a prefabricated solder ball, ball bumping or wedge bumping, a solder bump core of a material having a melting temperature in excess of the soldering temperature and of a height corresponding substantially to the predetermined height; and depositing, by wedge bumping, on the solder bump core a solder material comprising a large proportion of the material of solder bump to be melted for a solder connection.

2. The method of claim 1, further comprising the step of planarizing the solder bump core prior to depositing the solder material.

3. The method of claim 1, wherein the step of forming a solder bump core is performed with a metal from the group consisting of palladium, lead, gold and copper in a high percentage.

4. The method of claim 1, wherein the step of depositing the solder material is performed with one of pure tin and an alloy from the group consisting of tin-lead, tin-silver and indium-tin.

5. The method of claim 1, wherein the step of forming the solder bump core is performed with a compound comprising in excess of 90% by weight of palladium and the step of depositing the solder material is performed with an alloy of tin and lead.

6. The method of claim 1, wherein the step of forming the solder bump core is performed with a compound comprising in excess of 90% by weight of gold and the step of depositing the solder material is performed with an alloy of one of tin and lead and tin and silver.

7. The method of claim 2, further comprising the step of subjecting the solder core bump to reflow thereby melting at least the solder material to impart thereto homogenization and a cuspated configuration.

8. The method of claim 7, further comprising the step of forming a eutectic solder material by a metallurgic reaction during the reflow process.

9. The method of claim 8, further comprising the step of utilizing the eutectic solder material for forming a solder connection.

10. A method of forming on a contact surface a non-homogeneous solder bump of the kind providing for a solder connection of a predetermined height, comprising the steps of:

depositing on the contact surface a first ball bump by ball bumping as a solder bump core of a material having a melting temperature in excess of the soldering temperature and of a height corresponding substantially to the predetermined height;

planarizing a contact surface of the solder bump core; and depositing on the planarized contact surface a second ball bump by ball bumping as a solder material comprising a large proportion of the material of solder bump to be melted for a solder connection.

11. The method of claim 10, further comprising the step of subjecting the solder bump core and the solder material to a reflow process thereby to melt at least the solder material and to impart thereto homogenization and a cuspated configuration on the solder bump core.

12. The method of claim 10, wherein the step of depositing the first ball bump is performed with a metal from the group consisting of palladium, gold, copper and lead in a high percentage.

13. The method of claim 10, wherein the step of depositing the second ball bump is performed with one of pure tin and an alloy from the group consisting of tin-lead, tin-silver and indium-tin.

14. The method of claim 10, wherein the step of depositing the first ball bump is performed with a material from the group consisting of not less than 90% by weight of palladium and not less than 90% by weight of gold and not less than 70% of lead and the step of depositing the second ball bump is performed with a eutectic alloy of tin and lead.

15. The method of claim 11, further comprising the step of forming a eutectic solder material by a metallurgic reaction during the reflow process.

16. The method of claim 15, further comprising the step of utilizing the eutectic solder material for forming a solder connection.

17. A method of forming on a contact surface a non-homogeneous solder bump of the kind providing for a solder connection of a predetermined height, comprising the steps of:

depositing on the contact surface a solder bump core as a core layer by one of a galvanic and current-free process of a material having a melting temperature in excess of the soldering temperature and of a height corresponding substantially to the predetermined height; and mechanically depositing on the core layer by wedge bumping a solder material comprising a large proportion of the material of the solder bump to be melted for a solder connection.

18. The method of claim 17, further comprising the step of subjecting the solder bump to a reflow process thereby to melt at least the solder material to impart to it homogenization and a cuspated configuration on the surface of the solder bump.

19. The method of claim 17, wherein the step of depositing the solder material is performed with a eutectic alloy.

20. The method of claim 17, wherein the step of depositing the core layer is performed by galvanic precipitation of a metal from the group consisting of gold, copper, and lead.

21. The method of claim 17, wherein the step of depositing the core layer is performed by a current-free precipitation of a metal from the group consisting of nickel, copper and palladium.

22. The method of claim 17, wherein the step of depositing the core layer is performed by vapor deposition of a metal from the group consisting of lead, copper and gold.

23. The method of claim 17, wherein the step of depositing the solder material is performed with a material from the group consisting of an alloy of lead and tin, indium and tin, and tin and silver.

24. A solder bump of a non-homogenous material for providing a solder connection of a predetermined height, comprising:

means for forming a contact surface;

a first ball bump forming a core section having first substantially planar surface bonded to the contact surface and a second substantially planar surface disposed substantially parallel to the first surface at a spacing substantially equal to the predetermined height, the core section having a melting temperature in excess of the soldering temperature;

solder material comprising a second ball bump deposited on the second surface and comprising a large proportion of material of the solder bump to be melted for a solder connection.

25. The solder bump of claim 24, wherein the second ball bump comprises a eutectic material alloy.

26. The solder bump of claim 24, wherein the core section comprises a material from the group consisting of palladium, gold, lead and copper in a high percentage.

27. The solder bump of claim 24, wherein the second ball bump comprises a material from the group consisting of an alloy of tin and lead, tin and silver and tin and indium.

28. The solder bump of claim 24, wherein the core section comprises of a material of the group consisting of palladium and gold of not less than 90% and lead not less than 70% and wherein the second ball bump comprises a eutectic alloy of tin and lead.

29. A solder bump of a non-homogenous material for providing a solder connection of a predetermined height, comprising:

means for forming a contact surface;

a first ball bump forming a core section configured as a solder bump base deposited on the contact surface, the solder bump base being of a height substantially equal to the predetermined height and having a melting temperature in excess of the soldering temperature; and solder material deposited on the solder bump base and structured to be free of contact with the contact surface.

30. The solder bump of claim 29, wherein the solder bump core is configured as a first planarized ball bump comprising a first substantially planar surface bonded to the contact surface and a second substantially planar surface substantially parallel to the first surface.

31. The solder bump of claim 29, wherein the core section is made from a material of long term stability from the group consisting of gold, nickel, copper, palladium, lead and alloys of palladium and silver.

32. The solder bump of claim 29, wherein the solder material comprises a material from the group consisting of pure tin and alloys of lead and tin, tin and silver and tin and indium.

33. The solder bump of claim 29, wherein the solder material comprises material components of a eutectic composition.

34. The solder bump of claim 29, wherein the core section comprises an alloy comprising from about 90 to about 95% by weight of lead and from about 10 to about 5% by weight of tin and wherein the solder material comprises one of pure tin and a eutectic alloy of tin and lead.

35. The solder bump of claim 29, wherein the core section consists of a material of a high percentage of palladium and wherein the solder material consists of an alloy of tin and lead.

36. The solder bump of claim 29, wherein the core section consists of pure gold.

37. The solder bump of claim 29, wherein the core section consists of pure nickel.

38. The solder bump of claim 33, wherein the core section comprises at least one layer and wherein the solder material is deposited on the one layer, the solder material and the one layer comprising the components of the eutectic composition.

* * * * *